(12) United States Patent
Duan et al.

(10) Patent No.: US 9,997,626 B2
(45) Date of Patent: Jun. 12, 2018

(54) NLDMOS DEVICE AND METHOD FOR MANUFACTURING THE SAME

(71) Applicant: SHANGHAI HUAHONG GRACE SEMICONDUCTOR MANUFACTURING CORPORATION, Shanghai (CN)

(72) Inventors: Wenting Duan, Shanghai (CN); Donghua Liu, Shanghai (CN); Wensheng Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days. days.

(21) Appl. No.: 14/982,287

(22) Filed: Dec. 29, 2015

(65) Prior Publication Data

US 2016/0351704 A1    Dec. 1, 2016

(30) Foreign Application Priority Data

May 25, 2015    (CN) .......................... 2015 1 0270359

(51) Int. Cl.
| | |
|---|---|
| H01L 29/78 | (2006.01) |
| H01L 29/66 | (2006.01) |
| H01L 29/10 | (2006.01) |
| H01L 29/06 | (2006.01) |
| H01L 29/40 | (2006.01) |
| H01L 29/423 | (2006.01) |

(52) U.S. Cl.
CPC ...... H01L 29/7816 (2013.01); H01L 29/0634 (2013.01); H01L 29/1095 (2013.01); H01L 29/66659 (2013.01); H01L 29/66681 (2013.01); H01L 29/7835 (2013.01); *H01L 29/402* (2013.01); *H01L 29/42368* (2013.01)

(58) Field of Classification Search
None
See application file for complete search history.

(56) References Cited

U.S. PATENT DOCUMENTS

| 6,168,983 | B1 * | 1/2001 | Rumennik | ............ H01L 21/266 257/338 |
|---|---|---|---|---|
| 6,492,679 | B1 * | 12/2002 | Imam | ................. H01L 29/0634 257/342 |
| 6,787,437 | B2 * | 9/2004 | Rumennik | .......... H01L 29/0619 257/E21.417 |

(Continued)

FOREIGN PATENT DOCUMENTS

| CN | 1433083 A | 7/2003 |
|---|---|---|
| CN | 1494742 A | 5/2004 |

(Continued)

*Primary Examiner* — Michael Lebentritt
*Assistant Examiner* — Jordan Klein
(74) *Attorney, Agent, or Firm* — MKG LLC

(57) ABSTRACT

An NLDMOS device that includes a drift region, a P well, and a first PTOP layer and a second PTOP layer formed on the drift region, wherein the first PTOP layer has the same lateral size with the second PTOP layer, the first PTOP layer is spaced from the second PTOP layer in the longitudinal direction and located on the bottom of the second PTOP layer, with the depth of the first PTOP layer less than or equal to that of the bottom of the P well. The present invention also discloses a method for manufacturing the NLDMOS device.

17 Claims, 4 Drawing Sheets

(56) References Cited

U.S. PATENT DOCUMENTS

| | | | | |
|---|---|---|---|---|
| 7,008,865 B2* | 3/2006 | Uno | ................. | H01L 29/0634 |
| | | | | 257/339 |
| 2002/0098637 A1* | 7/2002 | Hossain | ................. | H01L 21/266 |
| | | | | 438/200 |
| 2002/0130360 A1* | 9/2002 | Imam | ................. | H01L 29/0634 |
| | | | | 257/335 |
| 2002/0137292 A1* | 9/2002 | Hossain | ................. | H01L 29/0634 |
| | | | | 438/289 |
| 2003/0027396 A1* | 2/2003 | Imam | ................. | H01L 29/0634 |
| | | | | 438/306 |
| 2003/0073313 A1 | 4/2003 | Pendharkar et al. | | |
| 2005/0151207 A1 | 7/2005 | Moscatelli et al. | | |
| 2014/0264587 A1* | 9/2014 | Moon | ................. | H01L 29/7816 |
| | | | | 257/343 |
| 2016/0181369 A1* | 6/2016 | Ning | ................. | H01L 29/1058 |
| | | | | 257/269 |

FOREIGN PATENT DOCUMENTS

| | | | |
|---|---|---|---|
| CN | 1841775 | A | 10/2006 |
| CN | 101677109 | A | 3/2010 |
| CN | 101740392 | A | 6/2010 |
| CN | 102044563 | A | 5/2011 |
| CN | 102074579 | A | 5/2011 |
| CN | 102130163 | A | 7/2011 |
| CN | 102130164 | A | 7/2011 |
| CN | 102136494 | A | 7/2011 |
| TW | 437049 | B | 5/2001 |
| TW | 484213 | B | 4/2002 |

\* cited by examiner

NLDMOS DEVICE AND METHOD FOR MANUFACTURING THE SAME

FIELD OF THE INVENTION

The present invention relates to the field of semiconductor integrated circuit manufacture, particularly to an N-type laterally diffused metal oxide semiconductor (NLDMOS) device; the present invention further relates to a method for manufacturing the NLDMOS device.

BACKGROUND OF THE INVENTION

The 500 V laterally diffused metal oxide semiconductor (LDMOS) has both the characteristic of high voltage and current of a discrete device, and the advantage of high-density intelligent logic control of a low-voltage integrated circuit, allowing a single chip to achieve the function that is originally achieved by multiple chips, thereby greatly reducing the area and cost and improving the energy efficiency, in line with the development of miniaturization, intelligence and low energy consumption of modern electronic devices.

As a key parameter for examining the 500 V devices, the breakdown voltage is particularly important. The prior art can promote depletion of the drift region by forming a PTOP layer on the drift region, thus reducing the surface field (Resurf) effect. As shown in FIG. 1 is a schematic view of the structure of an existing NLDMOS device. An N-type deep well 2 is formed on a silicon substrate 1, a P well 4 is spaced from a drift region and also surrounded by the N-type deep well 2, field oxide 3 is formed on the N-type deep well 2, a gate is composed of a gate oxide layer 6 and a polysilicon gate 7, a source region 8b is formed in the P well 4 and self-aligned with the polysilicon gate 7, a P well lead-out region 9 is formed on the P well 4 and composed of a P+ region, and a drain region 8a is formed on the drift region and self-aligned with a side of the field oxide 3. A polysilicon field plate 7a is formed at a side of the field oxide 3 adjacent to the drain region 8a, with both the polysilicon field plate 7a and the polysilicon gate 7 formed by photoetching the same polysilicon layer. An interlayer film 10 covers the region of the device on the bottom, with the source, drain and gate of the device led out through a contact hole and a front metal layer 11. A PTOP layer 5, formed on the drift region and also on the bottom of the P well 4 at the side of the source region 8b, is able to promote depletion of the drift region, reduce the surface field, and finally increase the breakdown voltage of the device.

SUMMARY

A technical problem to be solved by the present invention is to provide an NLDMOS device, which can make the drift region depleted deeper and wider, increase area of the depletion region, and raise the breakdown voltage of the device. Besides, the present invention further provides a method for manufacturing the NLDMOS device.

In order to solve the above technical problem, the NLDMOS device provided by the present invention comprises:

an N-type doped drift region, formed in a P-type semiconductor substrate;

a P well, formed in the P-type semiconductor substrate, with the P well laterally in contact with or spaced from the drift region;

a polysilicon gate, formed above the semiconductor substrate, spaced from the semiconductor substrate by a gate dielectric layer, extending to above the drift region laterally from the P well, the P well covered by the polysilicon gate being used for forming a channel, the polysilicon gate having its first side above the P well and its second side above the drift region;

a source region and a drain region, composed of an N+ region, the source region being formed in the P well and self-aligned with the first side of the polysilicon gate, the drain region being formed in the drift region;

a substrate lead-out region, composed of a P+ region, formed in the P well and used for leading out the P well, laterally in contact with the source region;

field oxide, located above the drift region between the P well and the drain region, having its second side laterally in contact with the drain region and its first side spaced from the P well, with the polysilicon gate extending to above the field oxide; and a first PTOP layer and a second PTOP layer, formed on the drift region, the first PTOP layer having the same lateral size with the second PTOP layer, the first PTOP layer being spaced from the second PTOP layer in the longitudinal direction and located on the bottom of the second PTOP layer, the depth of the first PTOP layer being less than or equal to that of the bottom of the P well.

As a further improvement, the drift region is composed of a first N-type deep well, and the P well is spaced from the drift region and surrounded by a second N-type deep well, with the first N-type deep well and the second N-type deep well having the same process conditions and spaced from each other.

As a further improvement, the first PTOP layer and the second PTOP layer are also formed on the bottom of the P well.

As a further improvement, the semiconductor substrate is a silicon substrate.

As a further improvement, the gate dielectric layer is a gate oxide layer.

As a further improvement, the field oxide is shallow trench field oxide or local field oxide.

As a further improvement, on the front side of the semiconductor substrate is formed an interlayer film, at the top of which are a source, a drain and a gate formed by a front metal layer, wherein, via the contact hole going through the interlayer film, the source contacts the source region and the substrate lead-out region, the drain contacts the drain region, and the gate contacts the polysilicon gate.

As a further improvement, on the side of the top of the field oxide adjacent to the drain region is formed a polysilicon field plate, with the polysilicon field plate connected to the drain via the contact hole going through the interlayer film.

In order to solve the above technical problem, the method for manufacturing the NLDMOS device of the present invention comprises the following steps:

Step 1: forming the N-type doped drift region on the P-type semiconductor substrate;

Step 2: forming the field oxide above the drift region;

Step 3: photoetching to open an injection region of the P well and carrying out injection of the P well to form the P well in the P-type semiconductor substrate, with the P well laterally in contact with or spaced from the drift region;

Step 4: photoetching to open a PTOP injection region, carrying out a first PTOP injection to form a first PTOP layer, and carrying out a second PTOP injection to form a second PTOP layer, with energy of the first PTOP injection greater than that of the second PTOP injection; with the first PTOP layer and the second PTOP layer formed on the drift region, the first PTOP layer has the same lateral size with the second PTOP layer, and the second PTOP layer is spaced from the first PTOP layer in the longitudinal direction and located on the bottom of the first PTOP layer, with the depth of the second PTOP layer less than or equal to that of the bottom of the P well;

Step 5: forming the gate dielectric layer and the polysilicon gate, wherein the polysilicon gate extends to above the drift region laterally from the P well, and the P well covered by the polysilicon gate is used for forming a channel, with the polysilicon gate having its first side above the P well and its second side above the field oxide at the top of the drift region;

Step 6: carrying out N+ injection to form the source region and the drain region, the source region being formed in the P well and self-aligned with the first side of the polysilicon gate, the drain region being formed in the drift region, the field oxide having its second side laterally in contact with the drain region; and Step 7: carrying out P+ injection to form the substrate lead-out region, which is formed in the P well and used for leading out the P well, and is laterally in contact with the source region.

With respect to the existing single PTOP layer, the present invention, by forming two PTOP layers, can make the drift region depleted deeper and wider, increase area of the depletion region, and raise the breakdown voltage of the device.

BRIEF DESCRIPTION OF THE DRAWINGS

The present invention will be further described below in detail with reference to drawings and specific embodiments.

DETAILED DESCRIPTION

Figure 1:
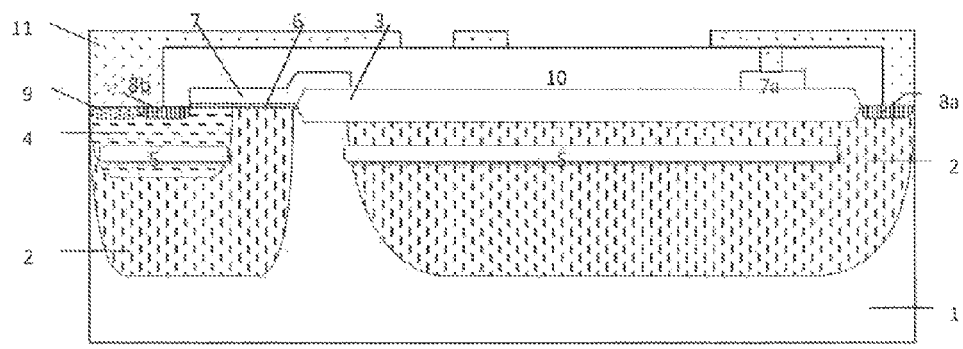
FIG. 1 is a schematic view of the structure of an existing NLDMOS device.
Figure 2:
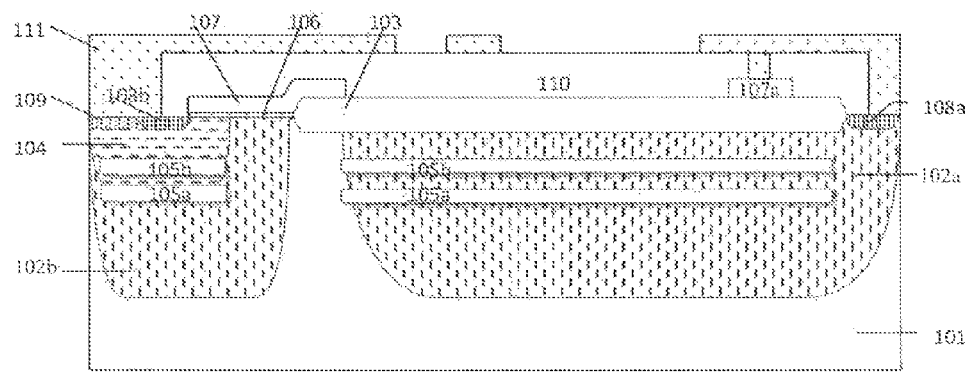
FIG. 2 is a schematic view of the structure of the NLDMOS device in the example of the present invention.

As shown in FIG. 2 is a schematic view of the structure of the NLDMOS device in the example of the present invention. The NLDMOS device of the example of the present invention includes: an N-type doped drift region, formed in a P-type semiconductor substrate 101, which is a silicon substrate; and a P well 104, formed in the P-type semiconductor substrate 101, with the P well 104 laterally in contact with or spaced from the drift region.

Preferably, the drift region is composed of a first N-type deep well 102a, and the P well 104 is spaced from the drift region and surrounded by a second N-type deep well 102b, with the first N-type deep well 102a and the second N-type deep well 102b having the same process conditions and spaced from each other.

A polysilicon gate 107, formed above the semiconductor substrate 101, spaced from the semiconductor substrate 101 by a gate dielectric layer 106 such as a gate oxide layer, extending to above the drift region laterally from the P well 104, the P well 104 covered by the polysilicon gate 107 being used for forming a channel, the polysilicon gate 107 having its first side above the P well 104 and its second side above the drift region.

A source region 108b and a drain region 108a, composed of an N+ region, the source region 108b being formed in the P well 104 and self-aligned with the first side of the polysilicon gate 107, the drain region 108a being formed in the drift region.

A substrate lead-out region 109, composed of a P+ region, formed in the P well 104 and used for leading out the P well 104, laterally in contact with the source region 108b.

Field oxide 103, located above the drift region between the P well 104 and the drain region 108a, having its second side laterally in contact with the drain region 108a and its first side spaced from the P well 104, the polysilicon gate 107 extending to above the field oxide 103, the field oxide 103 being shallow trench field oxide or local field oxide.

A first PTOP layer 105a and a second PTOP layer 105b, formed on the drift region, wherein the first PTOP layer 105a has the same lateral size with the second PTOP layer 105b, and it is spaced from the second PTOP layer 105b in the longitudinal direction and located on the bottom of the second PTOP layer 105b, with the depth of the first PTOP layer 105a less than or equal to that of the bottom of the P well 104; and the first PTOP layer 105a and the second PTOP layer 105b are also formed on the bottom of the P well 104.

On the front side of the semiconductor substrate 101 is formed an interlayer film 110, at the top of which are a source, a drain and a gate formed by a front metal layer 111, wherein, via the contact hole going through the interlayer film 110, the source contacts the source region 108b and the substrate lead-out region 109, the drain contacts the drain region 108a, and the gate contacts the polysilicon gate 107.

On the side of the top of the field oxide 103 adjacent to the drain region 108a is formed a polysilicon field plate 107a, which is connected to the drain via the contact hole going through the interlayer film 110.

Figure 3A:
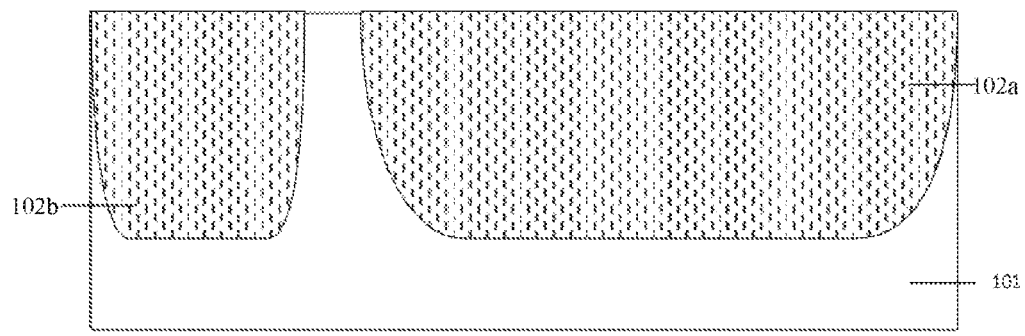
FIGS. 3A-3F are a schematic view of the structure of the device in the individual steps of the method in the example of the present invention.

FIGS. 3A-3F are a schematic view of the structure of the device in the individual steps of the method in the example of the present invention. The method for manufacturing the NLDMOS device in the example of the present invention includes the following steps:

Step 1: As shown in FIG. 3A, an N-type doped drift region is formed on a P-type semiconductor substrate 101. Preferably, the drift region is composed of the first N-type deep well 102a; the second N-type deep well 102b is formed while the first N-type deep well 102a is formed, with a certain distance between them; and the subsequently formed P well 104 is located in the second N-type deep well 102b.

The semiconductor substrate 101 is a silicon substrate.

Figure 3B:
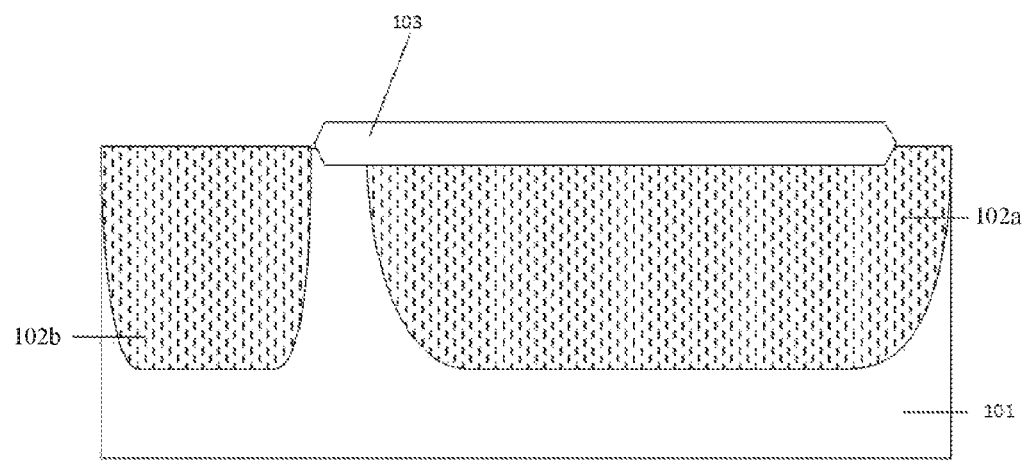

Step 2: As shown in FIG. 3B, the field oxide 103 is formed above the drift region. The field oxide 103 is the shallow trench field oxide formed by the shallow trench isolation (STI) process, or it is the local field oxide formed by the local field oxide process (LOCOS).

Figure 3C:
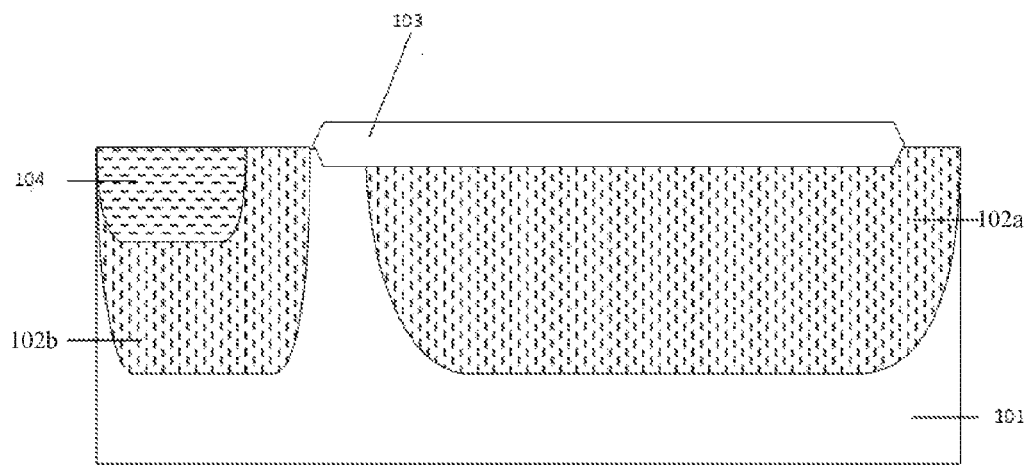

Step 3: As shown in FIG. 3C, an injection region of the P well 104 is opened by photoetching, and the P well 104 is formed in the P-type semiconductor substrate 101 through injection of the P well 104, with the P well 104 in the example of the present invention located in the second N-type deep well 102b.

Figure 3D:
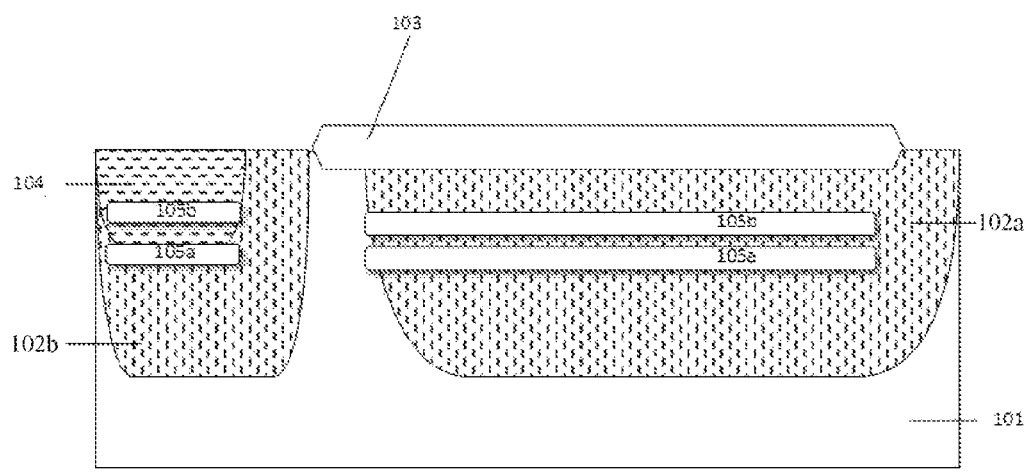
Figure 3E:
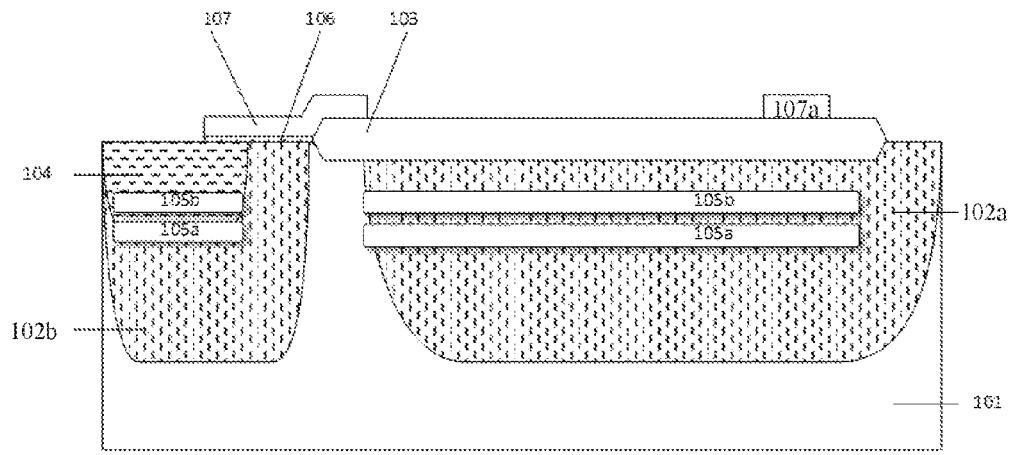
Figure 3F:
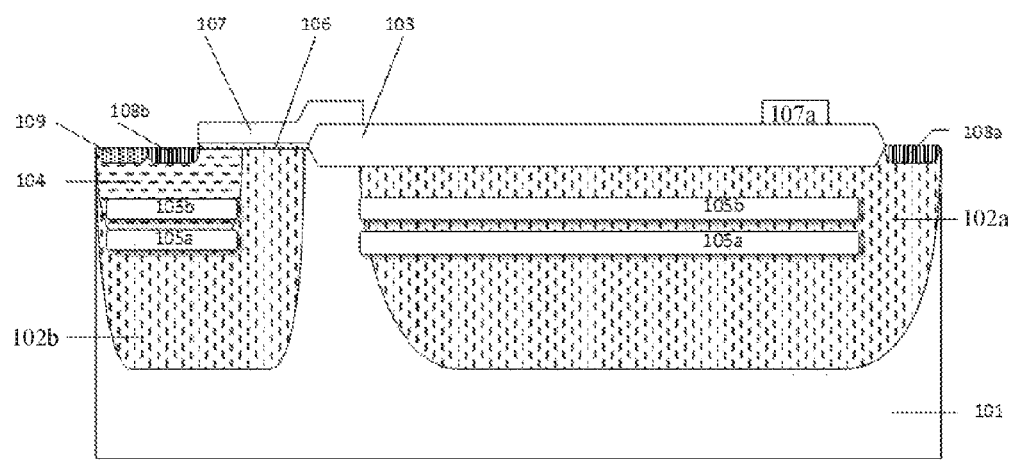

Step 4: As shown in FIG. 3D, a PTOP injection region is opened by photoetching, a first PTOP layer 105a is formed through a first PTOP injection, and a second PTOP layer 105b is formed through a second PTOP injection, with energy of the first PTOP injection greater than that of the second PTOP injection.

With the first PTOP layer 105a and the second PTOP layer 105b formed on the drift region, the first PTOP layer 105a has the same lateral size with the second PTOP layer 105b, i.e. it is defined by the same photomask; the second PTOP layer 105b is spaced from the first PTOP layer 105a in the longitudinal direction and located on the bottom of the first PTOP layer 105a, with the depth of the second PTOP layer 105b less than or equal to that of the bottom of the P well 104.

In this step, the first PTOP layer 105a and the second PTOP layer 105b are formed simultaneously on the bottom of the P well 104.

Step 5: Forming a gate dielectric layer such as the gate oxide layer 106 and the polysilicon gate 107. Wherein the polysilicon gate 107 extends to above the drift region laterally from the P well 104, and the P well 104 covered by the polysilicon gate 107 is used for forming a channel, with the polysilicon gate 107 having its first side above the P well 104 and its second side above the field oxide 103 at the top of the drift region.

In Step 5, a polysilicon field plate 107a is formed at the top of the field oxide 103 adjacent to the drain region 108a while the polysilicon gate 107 is formed.

Step 6: Forming a source region 108b and a drain region 108a through N+ injection. Wherein the source region 108b is formed in the P well 104 and self-aligned with the first side of the polysilicon gate 107, and the drain region 108a is formed in the drift region; the field oxide 103 has its second side laterally in contact with the drain region 108a, i.e. the drain region 108a is self-aligned with the second side of the field oxide 103.

Step 7: Carrying out P+ injection to form the substrate lead-out region 109, which is formed in the P well 104 and used for leading out the P well 104, and is laterally in contact with the source region 108b.

Step 8: Forming an interlayer film 110 on the front side of the semiconductor substrate 101.

Step 9: Forming the contact hole going through the interlayer film 110, with the contact hole in contact with the source region 108b and the substrate lead-out region 109 to which the bottom corresponds, the drain region 108a and the polysilicon gate 107.

Step 10: Forming a front metal layer 111 at the top of the interlayer film 110 and forming the source, the drain and the gate by photoetching. Wherein, via the contact hole going through the interlayer film 110, the source contacts the source region 108b and the substrate lead-out region 109, the drain contacts the drain region 108a, the gate contacts the polysilicon gate 107, and the polysilicon field plate 107a is connected to the drain.

Compared to the existing device composed of one PTOP layer, the example of the present invention, by using the two PTOP layers 105a and 105b and keeping the total injection dose consistent with the injection dose of the existing PTOP layer, can broaden and deepen depletion of the drift region only by changing the injection energy of the two PTOP layers 105a and 105b, thus increasing area of the depletion region and the breakdown voltage. It can be known through simulation that, the example of the present invention, by halving the PTOP injection dose and dividing the injection into two injections of different energy, increases the breakdown voltage by 7% from 594 V of the existing device to 637 V in the example of the present invention.

The present invention is described above in detail through specific examples, which, however, do not restrict the present invention. Without departing from the principle of the present invention, those skilled in the art may also make many variations and improvements, which should also be considered to be within the scope of protection of the present invention.

What is claimed is:
1. An NLDMOS device, comprising:
   an N-type doped drift region, formed in a P-type semiconductor substrate;
   a P well, formed in the P-type semiconductor substrate, with the P well laterally in contact with or spaced from the drift region;
   a polysilicon gate, formed above the semiconductor substrate, spaced from the semiconductor substrate by a gate dielectric layer, extending to above the drift region laterally from the P well, the P well covered by the polysilicon gate being used for forming a channel, the polysilicon gate having its first side above the P well and its second side above the drift region;
   a source region and a drain region, composed of an N+ region, the source region being formed in the P well and self-aligned with the first side of the polysilicon gate, the drain region being formed in the drift region;
   a substrate lead-out region, composed of a P+ region, formed in the P well and used for leading out the P well, laterally in contact with the source region;
   field oxide, located above the drift region between the P well and the drain region, having its second side laterally in contact with the drain region and its first side spaced from the P well, with the polysilicon gate extending to above the field oxide; and
   a first PTOP layer and a second PTOP layer, formed on the drift region, wherein the first PTOP layer has the same lateral size with the second PTOP layer, and it is spaced from the second PTOP layer in the longitudinal direction and located on the bottom of the second PTOP layer, with the depth of the first PTOP layer less than or equal to that of the bottom of the P well;
   wherein an injection dose of one PTOP layer for reducing surface field effect is divided into two doses for the first PTOP layer and the second PTOP layer respectively, so as to reduce surface electric field, increase depletion area of the drift region and increase breakdown voltage of the device.

2. The NLDMOS device according to claim 1, wherein the semiconductor substrate is a silicon substrate.

3. The NLDMOS device according to claim 1, wherein the gate dielectric layer is a gate oxide layer.

4. The NLDMOS device according to claim 1, wherein the field oxide is shallow trench field oxide or local field oxide.

5. The NLDMOS device according to claim 1, wherein on the front side of the semiconductor substrate is formed an interlayer film, at the top of which are a source, a drain and a gate formed by a front metal layer, wherein, with a contact hole going through the interlayer film, the source contacts the source region and the substrate lead-out region, the drain contacts the drain region, and the gate contacts the polysilicon gate.

6. The NLDMOS device according to claim 5, wherein on the side of the top of the field oxide adjacent to the drain region is formed a polysilicon field plate, which is connected to the drain via the contact hole going through the interlayer film.

7. A method for manufacturing the NLDMOS device according to claim 1, the method comprising:
   Step 1: forming the N-type doped drift region on the P-type semiconductor substrate;
   Step 2: forming the field oxide above the drift region;
   Step 3: photoetching to open an injection region of the P well and carrying out injection of the P well to form the P well in the P-type semiconductor substrate, with the P well laterally in contact with or spaced from the drift region;

Step 4: photoetching to open a PTOP injection region, carrying out a first PTOP injection to form a first PTOP layer, and carrying out a second PTOP injection to form a second PTOP layer, with energy of the first PTOP injection greater than that of the second PTOP injection; with the first PTOP layer and the second PTOP layer formed on the drift region, the first PTOP layer has the same lateral size with the second PTOP layer, and the second PTOP layer is spaced from the first PTOP layer in the longitudinal direction and located on the bottom of the first PTOP layer, with the depth of the second PTOP layer less than or equal to that of the bottom of the P well;

Step 5: forming the gate dielectric layer and the polysilicon gate, wherein the polysilicon gate extends to above the drift region laterally from the P well, and the P well covered by the polysilicon gate is used for forming a channel, with the polysilicon gate having its first side above the P well and its second side above the field oxide at the top of the drift region;

Step 6: carrying out N+ injection to form the source region and the drain region, the source region being formed in the P well and self-aligned with the first side of the polysilicon gate, the drain region being formed in the drift region, the field oxide having its second side laterally in contact with the drain region; and Step 7: carrying out P+ injection to form the substrate lead-out region, which is formed in the P well and used for leading out the P well, and is laterally in contact with the source region.

8. The method according to claim 7, wherein the drift region is composed of a first N-type deep well, and the P well is spaced from the drift region and surrounded by a second N-type deep well; in Step 1, formation regions of the first N-type deep well and the second N-type deep well are simultaneously opened by the photoetching process, and the first N-type deep well and the second N-type deep well are simultaneously formed by N-type ion injection.

9. The method according to claim 8, wherein in Step 4, the first PTOP layer and the second PTOP layer are simultaneously formed on the bottom of the P well.

10. The method according to claim 7, wherein the semiconductor substrate is a silicon substrate.

11. The method according to claim 7, wherein the gate dielectric layer is a gate oxide layer.

12. The method according to claim 7, wherein the field oxide is the shallow trench field oxide formed by a shallow trench isolation process, or the local field oxide formed by a local field oxide process.

13. The method according to claim 7, further comprising:

Step 8: forming the interlayer film on the front side of the semiconductor substrate;

Step 9: forming the contact hole going through the interlayer film, with the contact hole in contact with the source region and the substrate lead-out region to which the bottom corresponds, the drain region and the polysilicon gate; and Step 10: forming the front metal layer at the top of the interlayer film and forming the source, the drain and the gate by photoetching, wherein, via the contact hole going through the interlayer film, the source contacts the source region and the substrate lead-out region, the drain contacts the drain region, and the gate contacts the polysilicon gate.

14. The method according to claim 13, wherein in Step 5, a polysilicon field plate is formed at the top of the field oxide adjacent to the drain region while the polysilicon gate is formed, with the polysilicon field plate connected to the drain via the contact hole going through the interlayer film.

15. The NLDMOS device according to claim 1, wherein the drift region is composed of a first N-type deep well, and the P well is spaced from the drift region and surrounded by a second N-type deep well, with the first N-type deep well and the second N-type deep well having the same process conditions and spaced from each other.

16. The NLDMOS device according to claim 15, wherein the first PTOP layer and the second PTOP layer are also formed on the bottom of the P well.

17. An NLDMOS device, comprising:

an N-type doped drift region, formed in a P-type semiconductor substrate;

a P well, formed in the P-type semiconductor substrate, with the P well laterally in contact with or spaced from the drift region;

a polysilicon gate, formed above the semiconductor substrate, spaced from the semiconductor substrate by a gate dielectric layer, extending to above the drift region laterally from the P well, the P well covered by the polysilicon gate being used for forming a channel, the polysilicon gate having its first side above the P well and its second side above the drift region;

a source region and a drain region, composed of an N+ region, the source region being formed in the P well and self-aligned with the first side of the polysilicon gate, the drain region being formed in the drift region;

a substrate lead-out region, composed of a P+ region, formed in the P well and used for leading out the P well, laterally in contact with the source region;

field oxide, located above the drift region between the P well and the drain region, having its second side laterally in contact with the drain region and its first side spaced from the P well, with the polysilicon gate extending to above the field oxide; and a first PTOP layer and a second PTOP layer, formed on the drift region, wherein the first PTOP layer has the same lateral size with the second PTOP layer, and it is spaced from the second PTOP layer in the longitudinal direction and located on the bottom of the second PTOP layer, with the depth of the first PTOP layer less than or equal to that of the bottom of the P well; and wherein the field oxide is shallow trench field oxide or local field oxide;

wherein an injection dose of one PTOP layer for reducing surface field effect is divided into two doses for the first PTOP layer and the second PTOP layer respectively, so as to reduce surface electric field, increase depletion area of the drift region and increase breakdown voltage of the device.

* * * * *